(12) United States Patent
Wang et al.

(10) Patent No.: US 11,545,368 B2
(45) Date of Patent: Jan. 3, 2023

(54) PHOSPHORUS FUGITIVE EMISSION CONTROL

(71) Applicant: Applied Materials, Inc., Santa Clara, CA (US)

(72) Inventors: Cuiyang Wang, Andover, MA (US); Timothy J. Miller, Ipswich, MA (US); Jun Seok Lee, Andover, MA (US); Il-Woong Koo, Andover, MA (US); Deven Raj Mittal, Middleton, MA (US); Peter G. Ryan, Jr., Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/406,183

(22) Filed: Aug. 19, 2021

(65) Prior Publication Data
US 2021/0384041 A1   Dec. 9, 2021

Related U.S. Application Data

(62) Division of application No. 16/417,853, filed on May 21, 2019, now Pat. No. 11,127,601.

(51) Int. Cl.
*H01L 21/322* (2006.01)
*H01L 21/263* (2006.01)

(52) U.S. Cl.
CPC ...... *H01L 21/3221* (2013.01); *H01L 21/2633* (2013.01)

(58) Field of Classification Search
CPC ............. H01L 21/3221; H01L 21/2633; H01L 21/26513; H01L 21/2236; H01J 37/321; H01J 37/32412; H01J 37/32706
See application file for complete search history.

(56) References Cited

U.S. PATENT DOCUMENTS

| 6,555,451 B1 * | 4/2003 | Kub .................... H01L 21/2225 438/510 |
| 11,127,601 B2 | 9/2021 | Wang et al. |

(Continued)

FOREIGN PATENT DOCUMENTS

| JP | 2011-91394 A | 5/2011 |
| TW | 200945425 A | 11/2009 |
| TW | 201030850 A | 8/2010 |

OTHER PUBLICATIONS

International Search Report and Written Opinion dated Aug. 21, 2020 in corresponding PCT application No. PCT/US2020/030632.

*Primary Examiner* — Nilufa Rahim
(74) *Attorney, Agent, or Firm* — Nields, Lemack & Frame, LLC

(57) ABSTRACT

A method of processing and passivating an implanted workpiece is disclosed, wherein, after passivation, the fugitive emissions of the workpiece are reduced to acceptably low levels. This may be especially beneficial when phosphorus, arsine, germane or another toxic species is the dopant being implanted into the workpiece. In one embodiment, a sputtering process is performed after the implantation process. This sputtering process is used to sputter the dopant at the surface of the workpiece, effectively lowering the dopant concentration at the top surface of the workpiece. In another embodiment, a chemical etching process is performed to lower the dopant concentration at the top surface. After this sputtering or chemical etching process, a traditional passivation process can be performed.

8 Claims, 6 Drawing Sheets

(56) References Cited

U.S. PATENT DOCUMENTS

| | | | |
|---|---|---|---|
| 2010/0081253 | A1 | 4/2010 | Kurata et al. |
| 2010/0099263 | A1 | 4/2010 | Kao et al. |
| 2010/0200954 | A1 | 8/2010 | Del Agua Borniquel |
| 2011/0089469 | A1 | 4/2011 | Merckling |
| 2011/0092079 | A1 | 4/2011 | Auriac et al. |
| 2011/0256691 | A1 | 10/2011 | Ramaswamy et al. |
| 2012/0058252 | A1 | 3/2012 | Sweeney et al. |
| 2012/0322192 | A1 | 12/2012 | Graff et al. |
| 2013/0095643 | A1* | 4/2013 | Santhanam ....... H01J 37/32412 257/E21.334 |
| 2013/0288469 | A1 | 10/2013 | Sharma et al. |
| 2017/0117203 | A1 | 4/2017 | Tang et al. |
| 2020/0373170 | A1 | 11/2020 | Wang et al. |

* cited by examiner

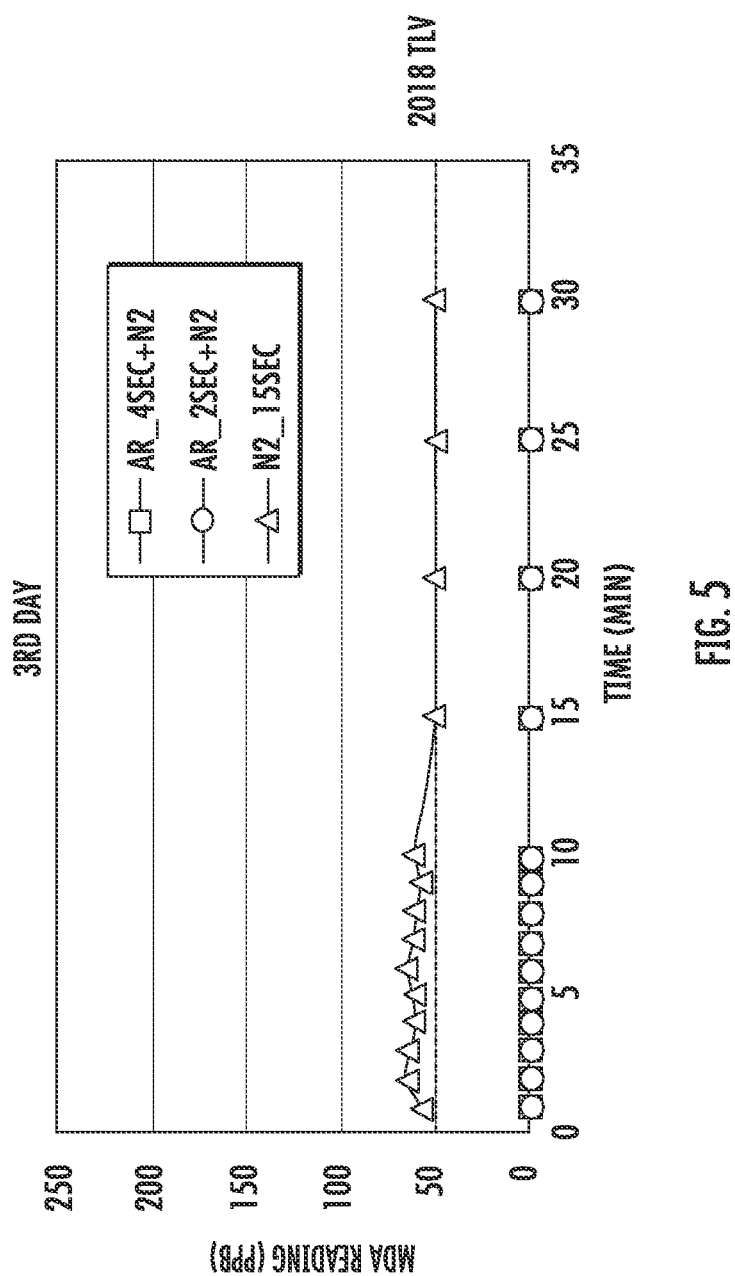

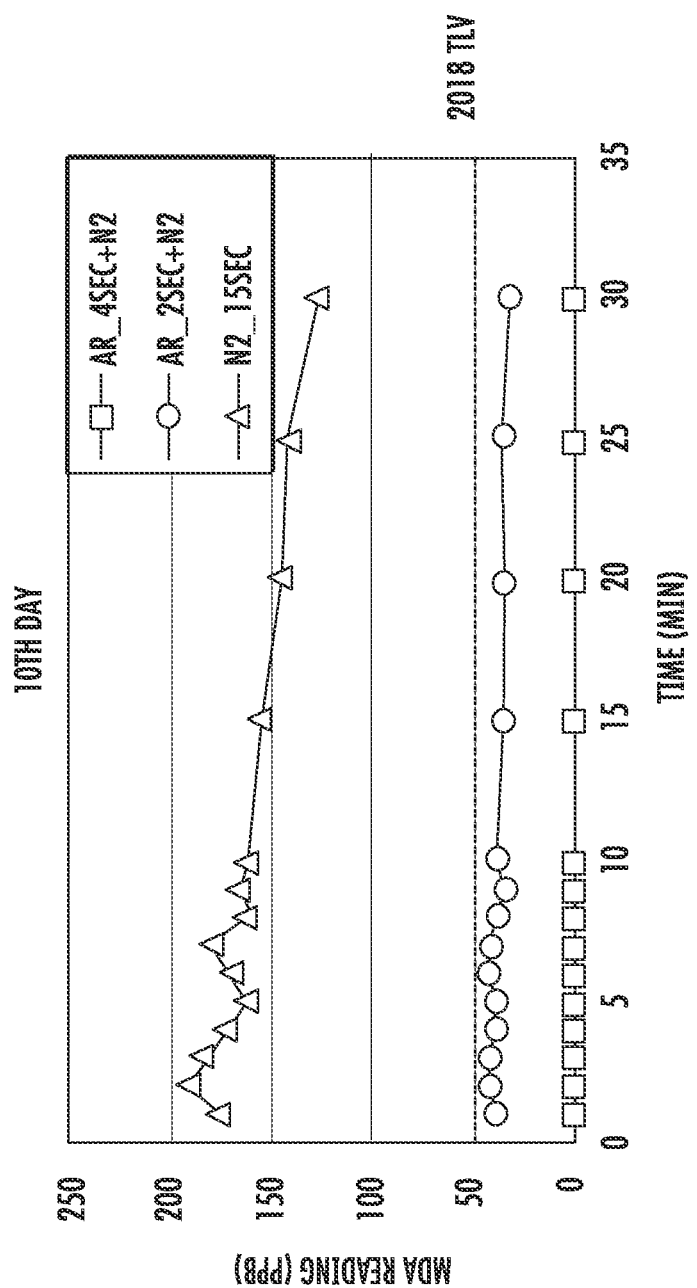

PHOSPHORUS FUGITIVE EMISSION CONTROL

This application is a divisional of U.S. patent application Ser. No. 16/417,853 filed May 21, 2019, the disclosure of which is incorporated herein by reference in its entirety.

FIELD

Embodiments of the present disclosure relate to methods for doping and passivating a workpiece implanted with a toxic species, such as phosphorus, and more particularly, to a method of reducing fugitive emissions from a workpiece implanted with a toxic species.

BACKGROUND

Semiconductor workpieces are often implanted with dopant species to create a desired conductivity. Implantation is an effective method of doping surfaces of a workpiece to form a semiconductor device.

Ions of the desired species are accelerated toward the workpiece and are implanted into the workpiece. The desired species may be atoms of molecules that contains the desired element, including Group III elements, such as boron aluminum and gallium; Group IV elements, such as carbon, silicon and germanium; and Group V elements, such as phosphorus and arsenic.

At times, the implanted species may migrate to the surface of the workpiece and diffuse out of the workpiece. This outgassing tends to reduce the concentration of the species in the workpiece.

In certain scenarios, these processed workpieces are placed in an enclosed container, such as a Front Opening Unified Pod (FOUP), for an extended period of time. Thus, any outgassing that occurs will be trapped within the FOUP and will accumulate over time. If the species is toxic, safety procedures are implemented to control the fugitive emissions.

Recently, government limits regarding fugitive emissions have been made stricter. For example, the Association Advancing Occupational and Environmental Health (ACGIH) recently reduced the threshold limit value (TLV) for phosphine from 300 ppm to only 50 ppm. Limits for other toxic gasses has also been reduced. The Environmental Protection Agency defines fugitive emissions as "those emissions which could not reasonably pass through a stack, chimney, vent, or other functionally-equivalent opening". Thus, outgassing from processed workpieces qualifies as fugitive emissions.

With this tightening of the limits on fugitive emissions, it would be beneficial to have methods of treating a workpiece that reduce the fugitive emissions to an acceptably low level. Further, it would be advantageous if this process was not time consuming or expensive.

SUMMARY

A method of processing and passivating an implanted workpiece is disclosed, wherein, after passivation, the fugitive emissions of the workpiece are reduced to acceptably low levels. This may be especially beneficial when phosphorus, arsine, germane or another toxic species is the dopant being implanted into the workpiece. In one embodiment, a sputtering process is performed after the implantation process. This sputtering process is used to sputter the dopant at the surface of the workpiece, effectively lowering the dopant concentration at the top surface of the workpiece. In another embodiment, a chemical etching process is performed to lower the dopant concentration at the top surface. After this sputtering or chemical etching process, a traditional passivation process can be performed.

According to one embodiment, a method of reducing gaseous emissions from a workpiece implanted with a dopant is disclosed. The method comprises removing the dopant from a top surface of the workpiece after implanting the workpiece; and passivating the top surface of the implanted workpiece. In certain embodiments, the dopant is removed from the top surface by sputtering. In certain embodiments, an inert gas is used to sputter the top surface. This inert gas may be argon. In certain embodiments, the dopant is removed from the top surface using chemical etching. In some embodiments, hydrogen, $CF_4$, or $NF_3$ is used during the chemical etching. In other embodiments, the dopant is removed from the top surface by a combination of sputtering and chemical etching. In certain embodiments, the passivating is performed in a nitrogen rich environment or an oxygen rich environment. In certain embodiments, the dopant comprises phosphine, arsine or germane.

According to another embodiment, a method of reducing gaseous emissions from an implanted workpiece is disclosed. The method comprises performing a sputtering process after the workpiece has been implanted, wherein the sputtering process reduces a surface concentration of a dopant from a top surface of the implanted workpiece; and performing a passivation process after the sputtering process to form a passivation layer on the top surface of the implanted workpiece. In certain embodiments, the sputtering process is performed using an inert gas. This inert gas may be argon. In certain embodiments, the sputtering process and the passivation process are performed in the same plasma chamber. In some embodiments, the passivation process is performed using nitrogen or oxygen. In certain embodiments, the workpiece is implanted with phosphine, arsine or germane.

According to another embodiment, a method of reducing gaseous emissions from a workpiece is disclosed. The method comprises implanting the workpiece with phosphine; removing the phosphine from a top surface of the workpiece after implanting the workpiece; and passivating the top surface of the implanted workpiece. In certain embodiments, the phosphine is removed using a sputtering process. In certain embodiments, the phosphine is removed using a chemical etching process. In certain embodiments, the phosphine is removed using a combination of a sputtering process and a chemical etching process. In certain embodiments, an amount of phosphine that is removed from the top surface is such that emissions from the workpiece, when stored in a sealed enclosure for 10 days with 24 similarly processed workpieces, are less than 50 ppm.

BRIEF DESCRIPTION OF THE FIGURES

For a better understanding of the present disclosure, reference is made to the accompanying drawings, which are incorporated herein by reference and in which:

FIGS. 3-6 show the concentration of phosphorus within a FOUP after 1, 2, 3 and 10 days, respectively.

DETAILED DESCRIPTION

Figure 1:
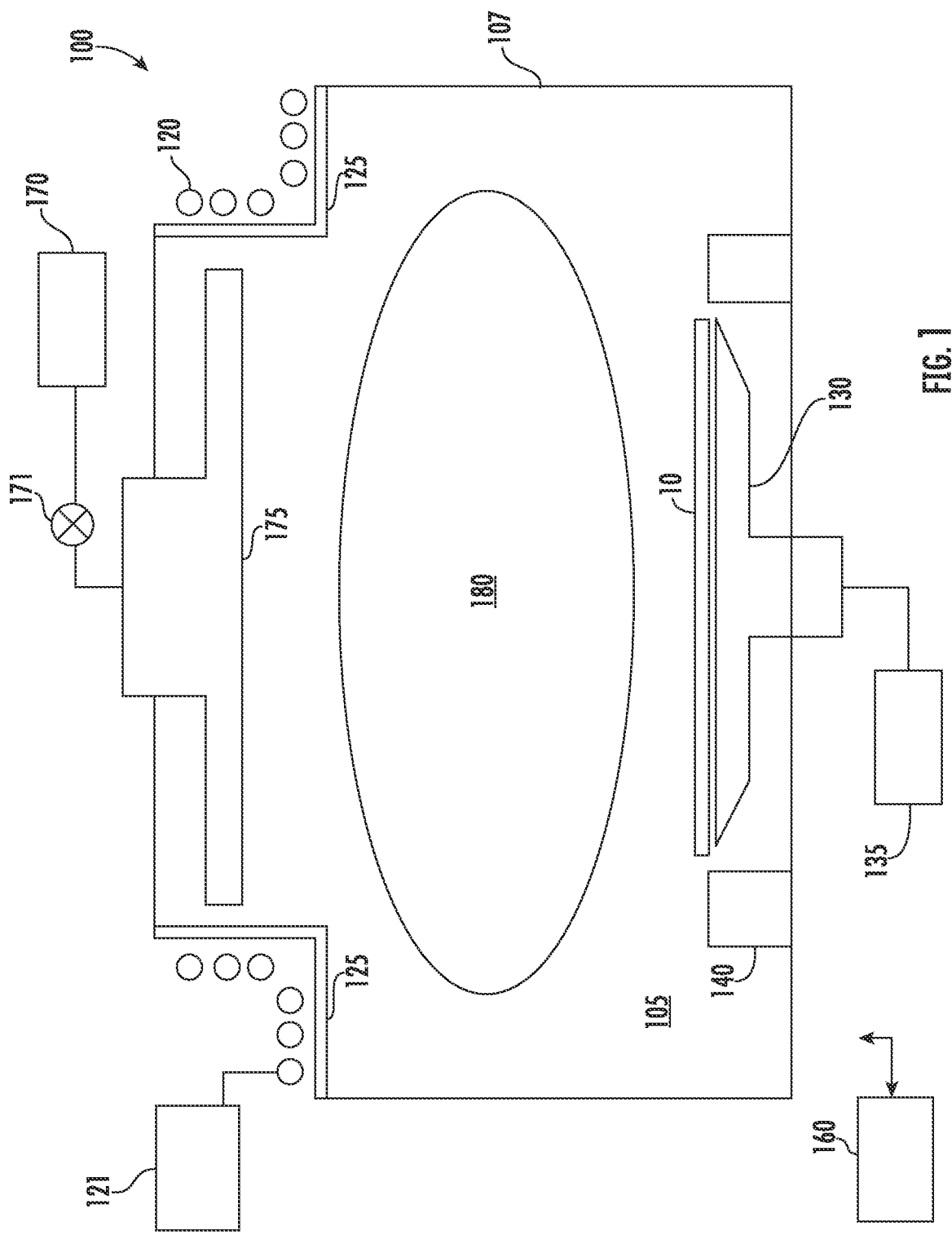
FIG. 1 shows the ion source according to one embodiment.

FIG. 1 shows a cross-section of an embodiment of a plasma chamber 105 of an ion source 100 that may be used with the present disclosure. The ion source 100 includes a plasma chamber 105 defined by several plasma chamber walls 107, which may be constructed from aluminum, graphite or another suitable material. This plasma chamber 105 may be supplied with one or more feed gasses, stored in one or more gas containers 170 that enters the plasma chamber 105 via a gas baffle 175. A mass flow controller 171 may be used to regulate the flow of the feed gas into the plasma chamber 105. This feed gas may be energized by an RF antenna 120 or another plasma-generation mechanism. The RF antenna 120 is in electrical communication with a RF power supply 121 which supplies power to the RF antenna 120. A dielectric window 125, such as a quartz or alumina window, may be disposed between the RF antenna 120 and the interior of the plasma chamber 105.

A workpiece 10 is disposed within the plasma chamber 105, on a platen 130. The platen 130 is in electrical communication with a bias power supply 135, which is used to negatively bias the platen 130 during certain time periods so that positive ions are attracted toward the workpiece 10. To protect the platen 130, a shield ring 140 may be disposed around the circumference of the platen 130.

A controller 160 may be in communication with the bias power supply 135 and the mass flow controller 171 that controls the flow of feed gas into the plasma chamber 105. The controller 160 may include a processing unit, such as a microcontroller, a personal computer, a special purpose controller, or another suitable processing unit. The controller 160 may also include a non-transitory storage element, such as a semiconductor memory, a magnetic memory, or another suitable memory. This non-transitory storage element may contain instructions and other data that allows the controller 160 to perform the functions described herein.

Figure 2:
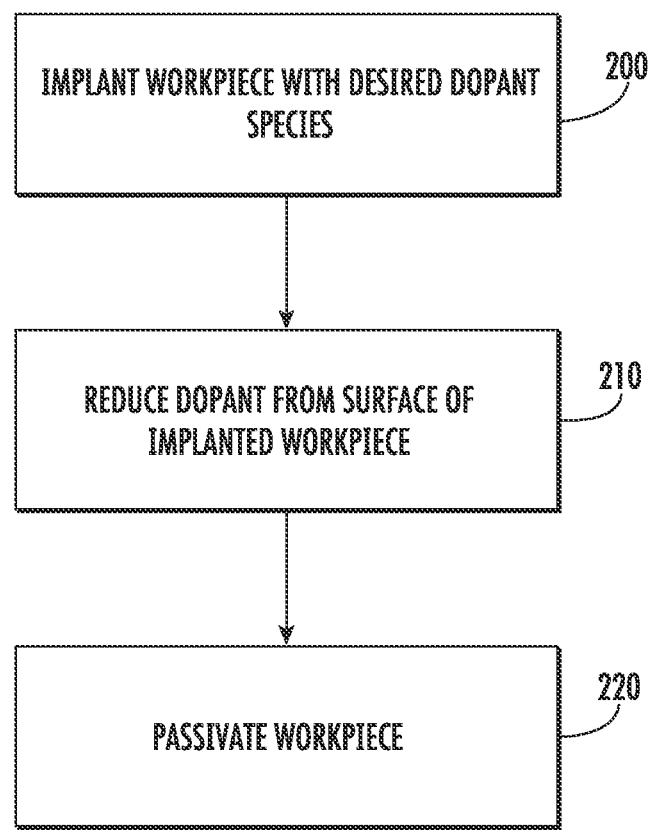
FIG. 2 is a representative flowchart showing the disclosed sequence.

One or more plasma chambers 105 may be used to perform the sequence described herein. FIG. 2 shows the sequence of processes that are used to reduce fugitive emissions. In Process 200, the workpiece is implanted with the desired dopant species.

During the implantation process, a feed gas is introduced into the plasma chamber 105 from the gas container 170. The RF antenna 120 is energized using the RF power supply 121, so as to create a plasma 180 in the plasma chamber 105.

The feed gas includes a dopant species that is intended to be implanted in the workpiece 10. For example, the dopant species may be a Group 3 element, such as boron, a Group 5 element, such as phosphorus or arsenic, or a Group 4 element, such as carbon or germanium. The feed gas may be phosphine ($PH_3$), arsine ($AsH_3$), germane ($GeH_4$) or another toxic species. In certain embodiments, a hydride of the dopant may be utilized. In other embodiments, a halogenated form of the dopant may be used.

Additionally, the platen 130 is negatively biased by the bias power supply 135 to attract positive ions from the plasma 180 toward the workpiece 10. The platen 130 may be energized with a pulsed DC pulse, an AC bias, or any other suitable waveform.

This implant may be a blanket implant, which implants an entirety of the surface of the workpiece 10; or may be a patterned implant, where only exposed portions of the surface of the workpiece 10 are implanted.

When the implantation process is complete, dopant will be implanted into at least a portion of the workpiece 10. In certain embodiments, a large concentration of dopant may reside at or near the surface of the workpiece 10. For example, the concentration of dopant may decrease as the distance from the surface increases. Over time, this dopant near the surface will diffuse to the surface and outgas from the workpiece 10.

To reduce the amount of outgassing, some of the dopant on the surface of the implanted workpiece is removed, as shown in Process 210. In one embodiment, a sputtering process is performed. This may be performed in the same plasma chamber 105 that was used to perform the implant process is used for this sputtering process. In another embodiment, a different plasma chamber, configured similar to that shown in FIG. 1, is used for the sputtering process.

For the sputtering process, a sputtering gas, typically an inert gas, such as argon, helium, neon, krypton or xenon, is used as the feed gas. The sputtering gas is introduced into the plasma chamber 105 from the gas container 170. The RF antenna 120 is energized using the RF power supply 121, so as to create a plasma 180 in the plasma chamber 105. Additionally, the platen 130 is negatively biased by the bias power supply 135 to attract positive ions from the plasma 180 toward the implanted workpiece. The platen 130 may be energized with a pulsed DC pulse, an AC bias, or any other suitable waveform. In certain embodiments, the bias voltage maybe between 0 and 1 kV, such as, for example, 500V.

The ions from the plasma 180 strike the surface of the implanted workpiece and cause dopant, located at the surface, to sputter off the workpiece 10. The sputtering rate may be adjusted by modifying the plasma density. This may be achieved by varying the pressure, and power applied to the RF antenna 120. Additionally, the sputtering rate may be adjusted by varying the amplitude, frequency or duty cycle of the DC bias voltage applied to the platen 130. In this way, the rate at which the dopant is sputtered may be controlled. For example, in one embodiment, argon may be introduced into the plasma chamber 105 at a flow rate of between 0 and 200 sccm, such as between 20 and 100 sccm. The pressure within the plasma chamber may be between 0 and 100 mTorr, such as between 0 and 25 mTorr. The power supplied to the RF antenna 120 may be between 0 and 2500 W, such as between 500 and 1500 W. The bias voltage applied to the platen may be a pulsed DC voltage having a frequency up to 10 kHz, an amplitude between 0 and 2000 V, and a pulse width between 0 and 200 μsec.

In addition to adjusting the sputtering rate, the duration of the sputter process may also be varied. For example, in some embodiments, the sputtering process takes about 2 seconds. In other embodiments, the sputtering process may be 4 seconds. Of course, other durations are also possible. The sputtering rate and the duration determine the amount of dopant that is ultimately sputtered from the top surface of the workpiece 10.

In another embodiment, chemical etching may be used to remove the dopant from the top surface of the implanted workpiece. For example, hydrogen, $CF_4$ or $NF_3$ may be used to remove the dopant from the top surface. This may be performed in a plasma chamber, similar to that shown in FIG. 1. Hydrogen, $CF_4$, $NF_3$ or another suitable species is used as the feed gas and may flow into the plasma chamber 105 at a flow rate between 0 and 200 sccm. The RF antenna 120 is energized using the RF power supply 121 at a power between 0 and 2500 W, so as to create a plasma 180 in the plasma chamber 105. The pressure within the plasma chamber 105 may be between 0 and 100 mTorr. Additionally, the platen 130 is negatively biased by the bias power supply 135 to attract positive ions from the plasma 180 toward the implanted workpiece to etch the top surface. In other embodiments, the platen 130 is not biased during the chemical etching process. The chemical etching process may be performed for 0-15 seconds, although other durations are also possible.

In yet another embodiment, the sputtering process and the chemical etching process are both employed. This may be performed simultaneously by introducing a feed gas comprising a mixture of an inert gas and hydrogen. Alternatively, these two processes may be performed sequentially.

In both of these processes, the objective is to reduce the surface concentration of the implanted species by removing the implanted species from the top surface. In certain embodiments, it may be possible to measure the actual surface concentration of the implanted species and terminate the sputtering or chemical etching process when the surface concentration is reduced below a predetermined threshold. In another embodiment, the length of the sputtering process or chemical etching process is determined empirically by testing fully processed workpieces. In certain embodiments, the sputtering process or chemical etching process may be performed for a sufficient duration such that the emissions from a processed workpiece, when stored in a sealed enclosure for a period of 10 days with 24 other similarly processed workpieces, is less than 50 ppm. In other words, the emissions from one processed workpiece, when stored in a sealed enclosure for a period of 10 days, is less than 2 ppm.

After the dopant on the top surface has been removed so that the surface concentration of the dopant is reduced, a passivation process is performed, as shown in Process 220. In one embodiment, the same plasma chamber 105 that was used to perform the sputtering process is used for this passivation process. In another embodiment, a different plasma chamber, configured similar to that shown in FIG. 1, is used for the passivation process. In one embodiment, a single plasma chamber is used for all three processes. In another embodiment, the implantation process is performed in one plasma chamber, and the sputtering and passivation processes are performed in a second plasma chamber. In yet another embodiment, three different plasma chambers are used to perform these three processes.

During the passivation process, a passivating gas, such as nitrogen or oxygen, is used as the feed gas. The passivating gas is introduced into the plasma chamber 105 from the gas container 170. The RF antenna 120 is energized using the RF power supply 121, so as to create a plasma 180 in the plasma chamber 105. Ions in the plasma react with the atoms and molecules at the top surface of the workpiece to form covalent bonds. Exposure of the workpiece to the nitrogen rich or oxygen rich environment allows for the creation of a passivation layer on the top surface of the workpiece. This passivation layer serves to lock in the dopant implanted in the workpiece 10. In one embodiment, nitrogen is introduced at a flow rate between 0 and 200 sccm, such as between 100 and 200 sccm. The pressure within the plasma chamber 105 may be between 0 and 100 mTorr. A power of between 0 and 2500 W may be applied to the RF antenna 120. The passivation process may be performed for 0-15 seconds, although other durations are also possible.

While the above disclosure describes the use of one or more plasma chambers, it is understood that one or more of these processes may be performed using a beam-line ion implantation system. Specifically, in certain embodiments, the implant process is performed using a beam-line ion implantation system.

The embodiments described in this disclosure may have many advantages. As noted above, threshold level values for various gasses is being reduced. The amount to reduce the outgassing of the dopant may be beneficial in ensuring that these new TLVs are met. For example, FIGS. 3-6 shows the concentration of phosphorus within a FOUP over time. In each of these tests, twenty five workpieces were stored in the FOUP. Since the workpieces are contained within the FOUP, which is a sealed enclosure, phosphine emissions accumulate over time. The current TLV for phosphorus is 50 ppm, as shown on the graphs.

Figure 3:
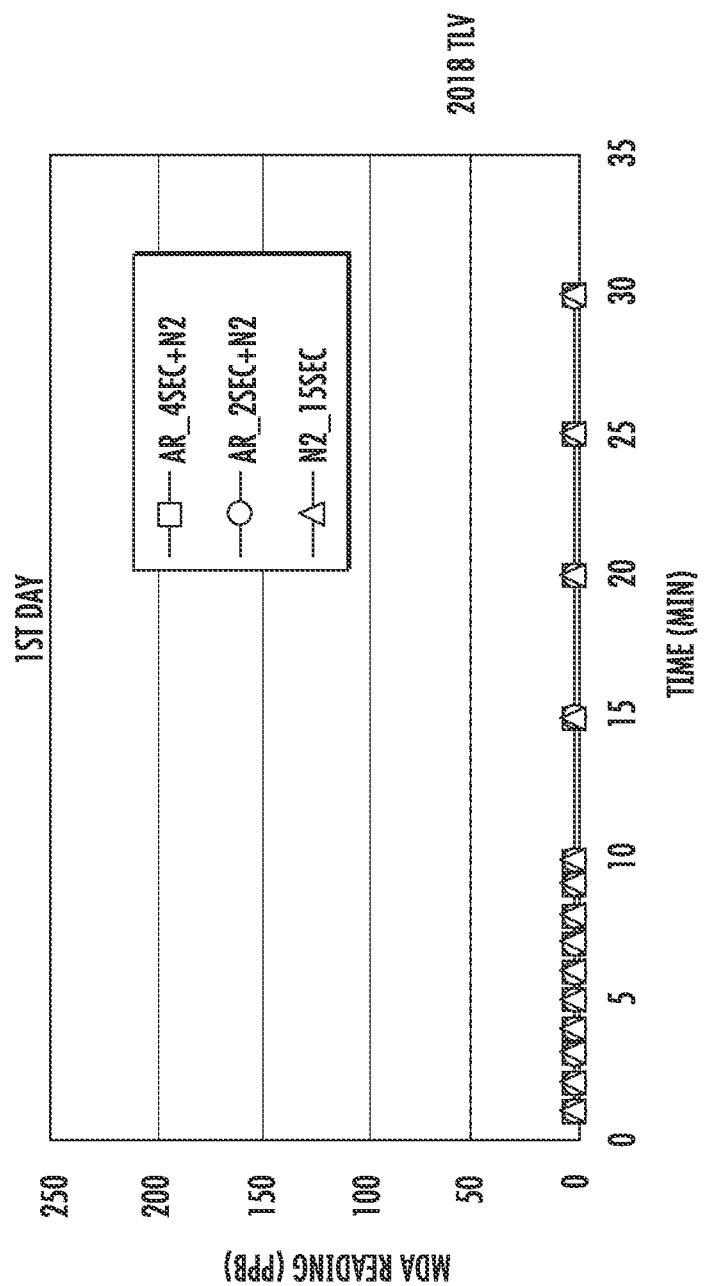
Figure 4:
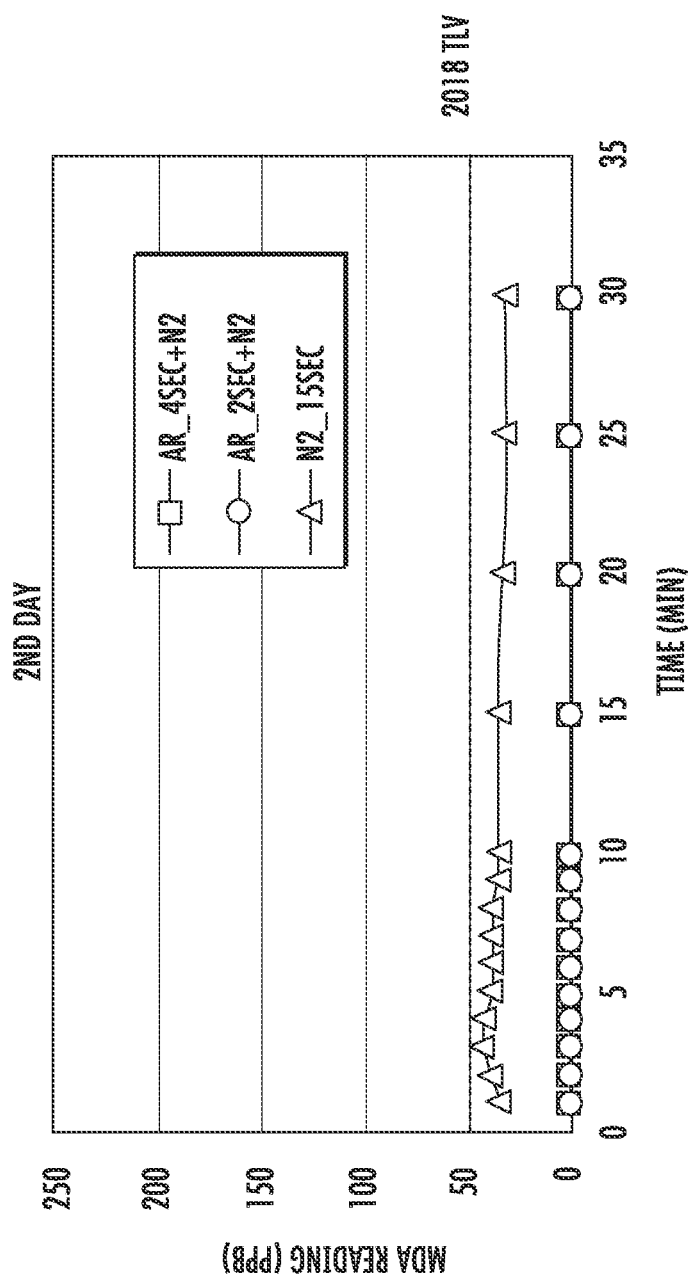

In this example, the workpieces were implanted using $PH_3$ at a dose of 5E15. As is well known, the phosphorus rich surface is unstable and volatile. Thus, a nitrogen passivation layer is applied to reduce this volatility. In all tests, the workpiece 10 was exposed to a nitrogen plasma for 15 seconds. No sputtering process was performed on the first test workpiece. In the second and third tests, a sputtering process was performed on the test workpieces prior to the passivation process. The sputtering process was performed using an RF power of 1200 W, a pressure of 12 millitorr, and a bias voltage having an amplitude of 0.5 kV, a frequency of 5 kHz and an on time of 80 μsec. The second test workpiece was sputtered with argon for two seconds. The third test workpiece was sputtered with argon for four seconds. After one day, as shown in FIG. 3, there is little difference in outgassing between these three test workpieces. For all test workpieces, the phosphine emissions are barely detectable. After the second day, as shown in FIG. 4, emissions from the first test workpiece are already approaching the new TLV. The values decrease during the measurement due to leakage of phosphine into the outside atmosphere. After the third day, as shown in FIG. 5, the emissions from the first test workpiece exceed the new TLV. After the tenth day, emissions from the second test workpiece are approaching the new TLV, but are still below this limit. The emissions from the third test workpiece are still barely detectable. Thus, this test clearly shows that phosphine emissions can be dramatically decreased through the use of a sputtering process after the implantation process and before the passivation process.

While this test was performed using argon as the sputtering gas, the disclosure is not limited to this embodiment. For example, other inert gasses, such as helium, neon, krypton or xenon may also be used. Further, while this test was performed using nitrogen as the passivating gas, the disclosure is not limited to this embodiment. For example, oxygen may be used to passivate the surface of the workpiece. Further, while the implanted species in these tests was phosphine, this technique can also be used for other toxic species, such as arsine or germane.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of reducing gaseous emissions from an implanted workpiece, comprising:

performing a chemical etching process after the workpiece has been implanted, wherein the chemical etching process reduces a surface concentration of a dopant from a top surface of the implanted workpiece, wherein an amount of dopant that is removed from the top surface is such that gaseous emissions from the workpiece, when stored in a sealed enclosure for 10 days with 24 similarly processed workpieces, are less than 50 ppm; and performing a passivation process after the chemical etching process to form a passivation layer on the top surface of the implanted workpiece.

2. The method of claim 1, wherein hydrogen, $CF_4$, or $NF_3$ is used during the chemical etching process.

3. The method of claim 1, wherein the passivation process is performed in a nitrogen rich environment or an oxygen rich environment.

4. The method of claim 1, wherein the dopant comprises phosphine, arsine or germane.

5. The method of claim 1, wherein a platen on which the workpiece is disposed is biased during the chemical etching process.

6. The method of claim 1, wherein a platen on which the workpiece is disposed is not biased during the chemical etching process.

7. The method of claim 1, wherein a duration of the chemical etching process is determined empirically.

8. The method of claim 1, wherein a duration of the chemical etching process is terminated when the surface concentration is reduced below a predetermined threshold.

* * * * *